United States Patent [19]
Tokui et al.

[11] Patent Number: 5,158,861
[45] Date of Patent: Oct. 27, 1992

[54] METHOD OF FORMING MINUTE PATTERNS USING CHEMICALLY AMPLIFYING TYPE RESIST

[75] Inventors: Akira Tokui; Masahiro Yoneda, both of Hyogo, Japan

[73] Assignee: Mitsubishi Denki Kabushiki Kaisha, Tokyo, Japan

[21] Appl. No.: 501,568

[22] Filed: Mar. 30, 1990

[30] Foreign Application Priority Data

Nov. 16, 1989 [JP] Japan ................... 1-300529

[51] Int. Cl.$^5$ ........................... G03F 7/38; G03F 7/40
[52] U.S. Cl. .................... 430/325; 430/272; 430/326; 430/330
[58] Field of Search ............... 430/325, 330, 326, 272

[56] References Cited

U.S. PATENT DOCUMENTS

Re. 31,220  4/1983  Ernsberger ............... 430/330

FOREIGN PATENT DOCUMENTS 63-3417  1/1988  Japan .
63-288017  11/1988  Japan .

OTHER PUBLICATIONS

Blum et al., "A study of the Effect of Key Processing Variables on the Lithographic Performance of Microposit SAL601-ER7 Resist," J. Vac. Sci. Technol. B 6(6), Nov./Dec. 1988, pp. 2280–2285.

Primary Examiner—Charles L. Bowers, Jr.
Assistant Examiner—John S. Chu
Attorney, Agent, or Firm—Lowe, Price, LeBlanc & Becker

[57] ABSTRACT

A method of forming a minute pattern with controlled resist profile uses a chemically amplifying type resist and deep UV rays. Microposit SAL601-ER7 is applied on a silicon substrate, to form a resist film of the resist on the silicon substrate. The resist film is selectively irradiated with KrF excimer laser beam by using a photomask. Thereafter, an electric field directed vertically downward is applied to the resist film while the resist film is heated. According to this method, H$^+$ ions which are a catalyst for cross linking generated in the resist film move vertically downward, so that diffusion of the H$^+$ ions in the lateral direction during heating can be prevented. Consequently, negative minute patterns having sidewalls formed vertical to the substrate can be provided.

12 Claims, 6 Drawing Sheets

METHOD OF FORMING MINUTE PATTERNS USING CHEMICALLY AMPLIFYING TYPE RESIST

BACKGROUND OF THE INVENTION

1. Field of the Invention

The present invention relates generally to a method of forming minute patterns and, more specifically, to a method of forming minute patterns by using a chemically amplifying type resist.

2. Description of the Background Art

A study on the performance of negative Microposit SAL601-ER7 resist (provided by Shipley Company, a novolak resin based electron beam resist) having both high sensitivity and high contrast has been reported (J. Vac. Sci. Technol. B6 (6), Nov/Dec 1988).

FIG. 4 shows a process for forming patterns by using the Microposit SAL601-ER7 described in the report mentioned above. Referring to FIG. 4, features of the Microposit SAL601-ER7 will be described.

The resist film of Microposit SAL601-ER7 comprises novolak resin, radiation sensitive acid generator, and a cross-linking agent. The resist film has a large difference between the dissolution rates of the unexposed and exposed areas of the film in aqueous alkaline developer. The magnitude of the dissolution rate of the resist film is determined by its degree of cross-linking. Upon exposure to the electron beam, the radiation sensitive acid generator releases acid into the film in proportion to the dose. After exposure, there is little difference between the dissolution rates of the exposed and the unexposed areas of the film. An image is formed in the film when the resist receives a post exposure bake because the acid catalized cross-linking step requires thermal energy. The degree of cross-linking of the exposed area is governed by both the dose and the post exposure bake conditions. If more acid is present in the film, less thermal energy is required to generate a given percentage of cross-linking. A resist having such features is called a chemically amplifying type resist.

Though Microposit SAL601-ER7 having the above described features is an electric beam resist, it is also sensitive to the deep UV range. The deep UV ray is used for forming minute patterns in lithography. If a technique for sensitizing the Microposit SAL601-ER7 with the deep UV ray is established, more minute patterns will be formed.

The inventors performed experiments to form minute patterns by using Microposit SAL601-ER7 as a resist and KrF excimer laser beam (having the wavelength of 248 nm) as a radiation beam. FIGS. 5A to 5E schematically show the results of the experiment in cross sections. Referring to FIG. 5A, a silicon substrate 1 is prepared. Referring to FIG. 5B, the Microposit SAL601-ER77 is applied on the silicon substrate 1 by spin coating, thereby forming a resist film 2 having a prescribed thickness. Thereafter, baking is performed for 60 to 80 sec at 90° to 100° C. prior to exposure, in order to vaporize the solvent.

Thereafter, referring to FIG. 5C, selective exposure to the KrF excimer laser beam 6 is carried out using a photomask 5, by reduction type projection printing. Consequently, exposed areas 2a and unexposed areas 2b are provided in the resist film 2. In the exposed areas 2a, $H^+$ ions which are the catalyst of the cross-linking reaction (simply represented by the sign + in the figure) are generated. Referring to FIG. 5D, the exposed resist is baked for 60 to 180 sec on a hot plate 4 heated to 80° to 140° C. By the catalyst of the $H^+$ ions, cross-linking reaction of the novolak resin occurs in the exposed areas 2a.

Referring to to FIG. 5E, development is carried out by using 2.38% tetramethyl ammonium hydroxide solution, then the unexposed portions are dissolved in the solution, and negative patterns 7 are provided as a result.

However, the profile of the resist 7 is tapered with the lower parts being narrower, as shown in FIG. 6B (which is a partial expansion of FIG. 5E). When the underlying layer is processed by, for example, reactive ion etching by using the pattern 7 having such a resist profile, the dimension cannot be well controlled.

The reason why the resist profile is tapered with the lower portion being narrower as shown in FIG. 6B is that the novolak resin included in the resist absorbs the KrF excimer laser beam well. More specifically, referring to FIG. 6A (which is a partial expansion of FIG. 5C), the KrF excimer laser beam 6 is much absorbed on the surface of the resist film 2, so that more $H^+$ ions are generated in the upper portion of the resist film 2, and the concentration of the $H^+$ ions becomes lower in the lower portion. In addition, $H^+$ ions are diffused in the lateral direction by heat. Therefore, when PEB is performed, the $H^+$ ions occupy a larger planar area in the upper portion of the resist and occupy a narrower area in the lower portion, as shown in FIG. 6A. Since the cross-linking reaction occurs where there are $H^+$ ions, the tapered resist profile with the lower portion being narrower is provided after development, as shown in FIG. 6B.

SUMMARY OF THE INVENTION

An object of the present invention is to provide a method of forming minute patterns with well controlled resist profile, by using chemically amplifying type resist.

Another object of the present invention is to provide a method of forming minute patterns with sidewalls formed vertical to a substrate by controlling the area of generation of cross-linking catalyst.

A further object of the present invention is to provide a method of forming minute patterns with resist profile well controlled by using a chemically amplifying type resist and deep UV ray.

A still further object of the present invention is to provide a method of forming minute patterns with the resist profile well controlled by using Microposit SAL601-ER7 which is a negative resist, and deep UV ray.

A still further object of the present invention is to provide a method of forming minute patterns with the resist profile well controlled by using a positive chemically amplifying type resist.

In order to attain the above described objects, in a method of forming negative minute patterns in accordance with the present invention, a negative chemically amplifying type resist including a base resin, a cross-linking agent for cross-linking the base resin and a radiation sensitive catalyst generator generating the catalyst of cross-linking reaction of the base resin is provided. Thereafter, the negative chemically amplifying type resist is applied on a substrate and dried to form a resist film on the substrate. The photoresist film is selectively irradiated with light. After radiation, the resist film is heated. After radiation, an electric field is applied to the resist film.

In a preferred embodiment of the method of the forming minute patterns in accordance with the present invention, the above described step of applying an electric field to the resist film is simultaneously carried out with the step of heating the resist film. Preferably, the step of applying an electric field to the resist film is carried out in vacuum.

In another aspect of the present invention, in the method of forming positive minute patterns, a positive chemically amplifying type resist including a base resin, dissolution preventing agent for preventing dissolution of the base resin in a developer, a radiation sensitive catalyst generator generating catalyst destroying the capability of preventing dissolution of the above mentioned dissolution preventing agent, is prepared. The positive chemically amplifying type resist is applied on a substrate and dried to form a resist film on the substrate. Thereafter, the resist film is selectively irradiated with light. After radiation, an electric field is applied to the resist film.

In accordance with the method of forming minute patterns using the negative chemically amplifying type resist, the resist film is selectively irradiated with light and thereafter electric field is applied to the resist film. Consequently, the catalyst of cross-linking reaction, for example, H+ ions generated in the resist film move vertically downward, whereby diffusion of the H+ ions in the lateral direction at the time of PEB can be suppressed. Consequently, negative minute patterns having sidewalls formed vertical to the substrate can be provided.

In accordance with the method of forming minute patterns using the positive chemically amplifying type resist of another aspect of the present invention, the resist film is selectively irradiated with light and thereafter electric field is applied to the resist film. Therefore, catalyst destroying the function of the dissolution preventing agent generated in the resist film, for example H+ ions move vertically downward, whereby diffusion of the H+ ions in the lateral direction at the time of PEB can be suppressed. Consequently, positive minute patterns having sidewalls formed vertical to the substrate can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following with reference to the figures.

FIGS. 1A to 1E are cross sectional views showing process steps of one embodiment of the present invention.

Figure 1A:
FIGS. 1A to 1E are cross sectional views showing the process for forming minute patterns in accordance with one embodiment of the present invention.
Figure 1B:
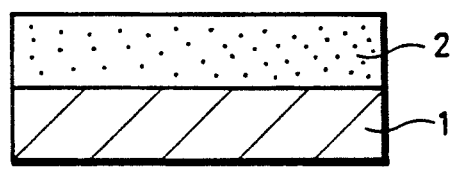

Referring to FIG. 1A, a silicon substrate 1 is prepared. Referring to FIG. 1B, Microposit SAL601-ER7 is applied on the silicon substrate 1 by spin coating, whereby a resist film 2 having an arbitrary thickness is formed. The thickness of the resist film 2 is preferably 2 μm or less. Thereafter, prior to exposure, baking is carried out for 30 to 90 sec at 50° to 100° C. in order to vaporize the solvent.

Figure 1C:
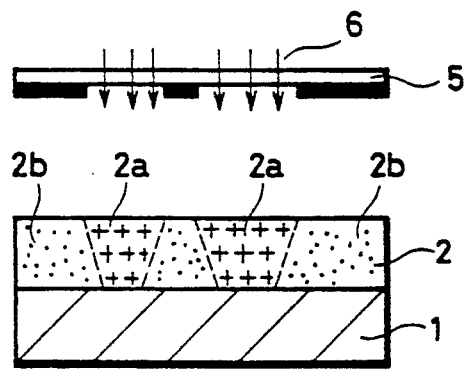

Referring to FIG. 1C, exposure to KrF excimer laser beam 6 is carried out using a photomask 5, in accordance with the reduction type projection printing. Consequently, exposed areas 2a and unexposed areas 2b are provided on the resist film 2. In the exposed areas 2a, H+ ions (simply represented by the sign + in the figure) which are the catalyst of cross-linking reaction are generated. As described above, the novolak resin included in Microposit SAL601-ER7 well absorbs the KrF excimer laser beam, so that KrF excimer laser beam 6 is much absorbed on the surface of the resist film 2. Consequently, H+ ions are generated much in the upper portion of the resist film 2, and the concentration of the H+ ions is reduced in the lower portion.

Figure 1D:
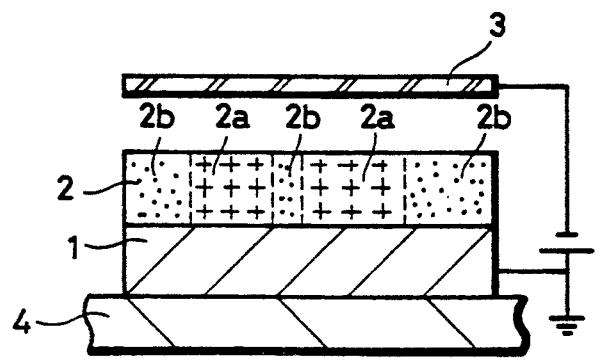
Figure 1E:
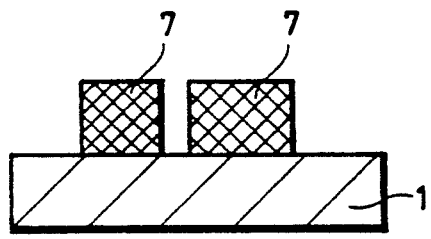

Referring to FIG. 1D, the silicon substrate 1 is placed on a hot plate 1, and an opposing electrode 3 is provided facing the silicon substrate 1 above the substrate 1. Potential is applied between the opposing electrode 3 and the silicon substrate 1 while the silicon substrate 1 is heated (PEB) to 100° to 140° C. by means of the hot plate 4. The potential is applied with the opposing electrode 3 being a positive electrode and the silicon substrate 1 being a negative electrode. Consequently, an electric field directed vertically downward is excited in the resist film 2. Preferably, the strength of the electric field is in the range of 10 to 100 KV/mm.

Figure 6A:
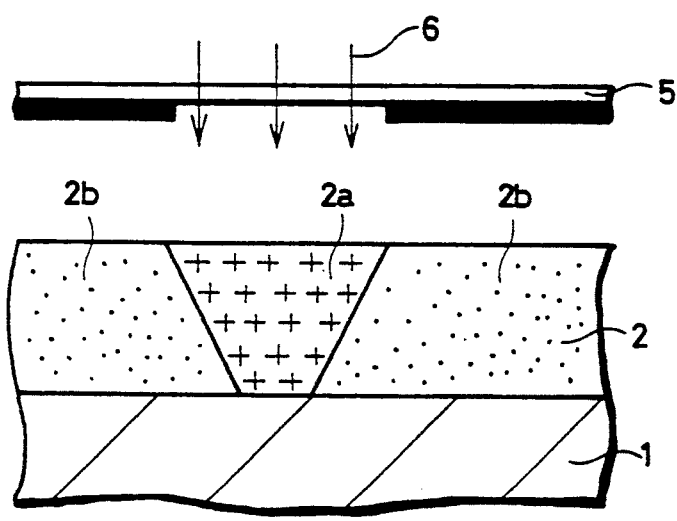
FIG. 6A is a partial expansion of the cross section of FIG. 5C.
Figure 6B:
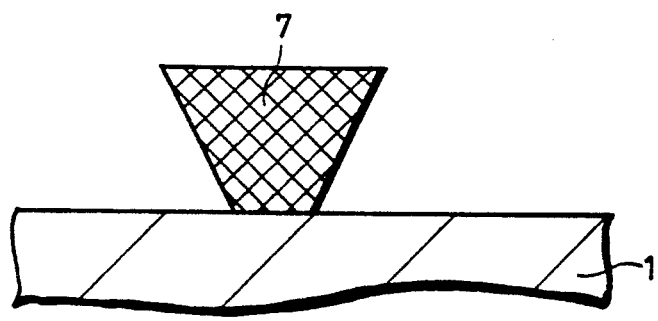
FIG. 6B is a partial expansion of the cross section of FIG. 5E.

Now, in the conventional method where the film is heated (PEB) without applying an electric field, the H+ ions generated in the resist film 2 preform crosslinking reaction while they are diffused in all directions. Every time the cross-linking reaction is done, H+ ions are emitted in the resist film 2a providing such distribution of the H+ ions as shown in FIG. 6A.

Figure 2:
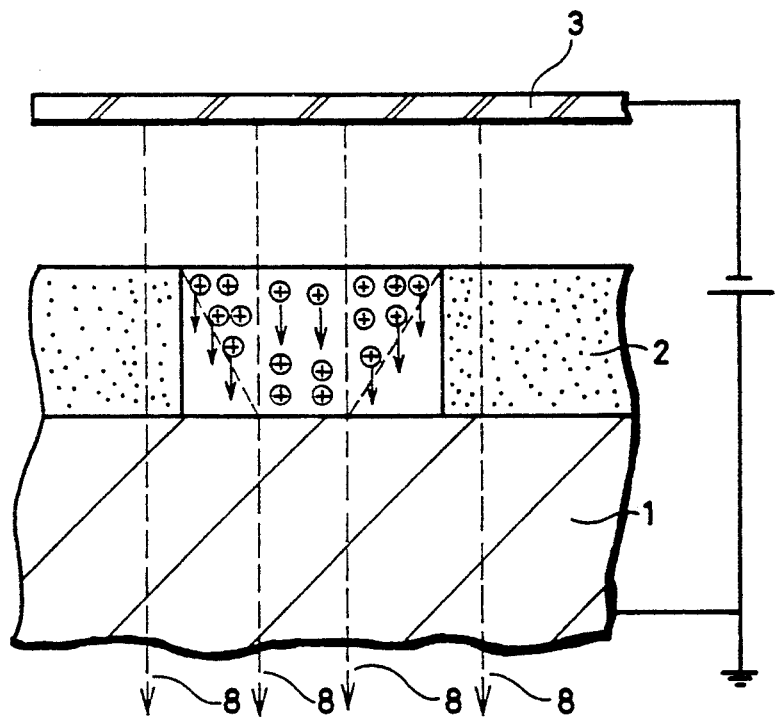
FIG. 2 is a cross sectional view showing the operation of the present invention.

On the contrary, referring to FIG. 2, when an electric field directed vertically downward to the resist film 2 is applied while the resist film 2 is heated as in the present embodiment, the H+ ions which are the catalyst of the cross-linking reaction generated in the resist film 2 move vertically downward simultaneously with the thermal diffusion. Consequently, diffusion of the H+ ions in the lateral direction during heating can be suppressed. Consequently, referring to FIG. 1E, when the resist film is developed by using 2.38% tetramethyl ammonium hydroxide solution, a negative minute pattern 7 having sidewalls formed vertical to the silicon substrate 1 is provided. Processing of the underlying layer can be carried out with the dimension controlled very well, by using the minute pattern 7 having such a resist profile.

Although there is a space between the opposing electrode 3 and the resist film 2 in the above embodiment, the present invention is not limited thereto, and the opposing electrode 3 and the resist film 2 may be directly in contact with each other. In that case, a specific effect of increased electric field strength can be obtained.

Although the atmosphere for carrying out heating (PEB) and application of the electric field has not specifically mentioned, these processes may be carried out in vacuum or inactive gas atmosphere such as helium, neon, argon or the like. Preferably, the electric field is applied in vacuum, especially when there is a space between the opposing electrode 3 and the resist film 2.

Although KrF excimer laser beam is used as an example of the deep UV ray in the foregoing, the present invention is not limited thereto.

FIGS. 3A to 3E are cross sectional views showing process steps of forming minute patterns using positive chemically amplifying type resist in accordance with another embodiment of the present invention.

The positive chemically amplifying type resist used in this embodiment comprises a base resin (for example, novolak resin, vinylphenol/styrene resin), a dissolution preventing agent (for example, naphtoquinondiazide) preventing dissolution of the base resin in the developer, and a radiation sensitive destroying catalyst generator (for example, onium salt) which generates catalyst (for example $H^+$ ions) to destroy the dissolution preventing capability of the dissolution preventing agent.

Figure 3A:
FIGS. 3A to 3E are cross sectional views showing the process in accordance with another embodiment of the present invention.
Figure 3B:
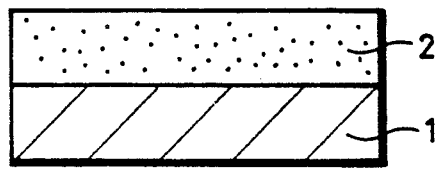

Referring to FIG. 3A, a silicon substrate 1 is prepared. Referring to FIG. 3B, a positive chemically amplifying type resist having the above described components is applied on the silicon substrate 1 by spin coating, to form a resist film 2 having a prescribed thickness.

Figure 3C:
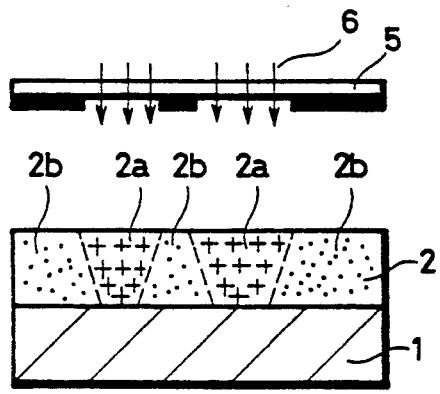

Referring to FIG. 3C, exposure to KrF excimer laser beam 6 is carried out using a photomask 5 in accordance with the reduction type projection printing. Consequently, exposed areas 2a and unexposed areas 2b are provided on the resist film 2. In the exposed areas 2a, catalyst $H^+$ ions (simply represented by the sign + in the figure) are generated, which destroys the capability of preventing dissolution of the dissolution preventing agent. In this case, the KrF excimer laser beam 6 is much absorbed on the surface of the resist film. Consequently, $H^+$ ions are much generated in the upper portion of the resist film 2, and the concentration of the $H^+$ ions is reduced in the lower direction.

Figure 3D:
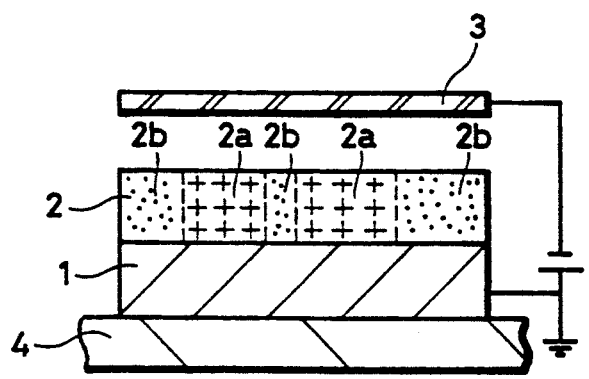

Referring to FIG. 3D, the silicon substrate 1 is placed on a hot plate 4. An opposing electrode 3 is provided above and opposed to the silicon substrate 1. An electric field is applied between the opposing electrode 3 and the silicon substrate 1 while the silicon substrate 1 is heated on the hot plate 4. The potential is applied with the opposing electrode 3 being the positive electrode and the silicon substrate 1 being the negative electrode. Consequently, an electric field directed downward is excited in the resist film 2, and the $H^+$ ions move vertically downward simultaneously with the thermal diffusion. The diffusion of the $H^+$ ions in the lateral direction during heating can be suppressed.

Figure 3E:
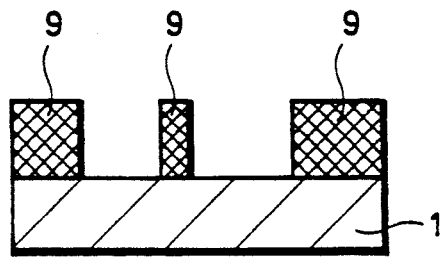
Figure 4:
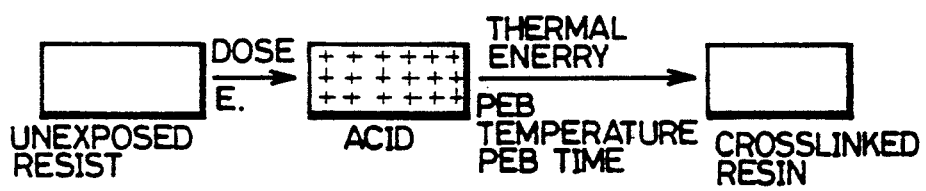
FIG. 4 schematically shows a process for forming patterns using Microposit SAL601-ER7.
Figure 4:
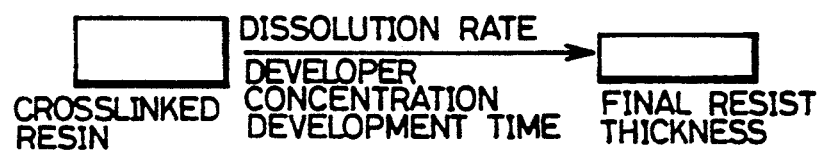
Figure 5A:
FIGS. 5A to 5E are cross sectional views showing process steps for forming minute patterns by using Microposit SAL601-ER7 as a resist and deep UV ray.
Figure 5B:
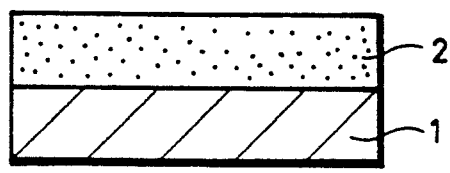
Figure 5C:
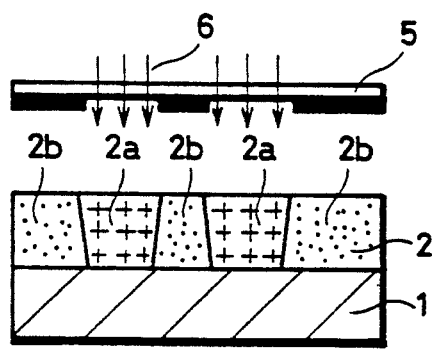
Figure 5D:
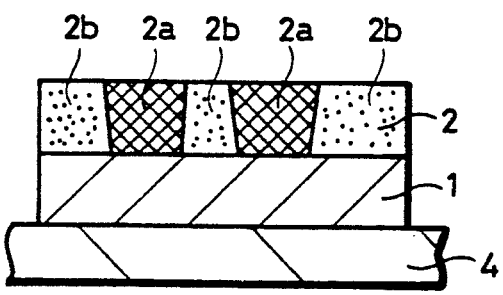
Figure 5E:
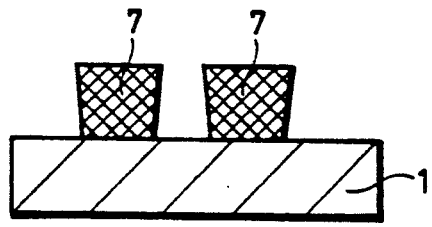

Consequently, referring to FIG. 3E, when it is developed by a developer, positive minute patterns 9 having sidewalls formed vertical to the silicon substrate 1 can be provided. When the positive minute patterns 9 having such resist profile are used, processing of the underlying layer can be carried out with the dimension controlled well.

As described above, in accordance with the method of forming minute patterns using a negative chemically amplifying type resist, the resist film is selectively irradiated with light and thereafter an electric field is applied to the resist film. Consequently, the catalyst of cross-linking reaction, for example $H^+$ ion generated in the resist film move vertically downward, suppressing diffusion of the $H^+$ ions in the lateral direction at the time of PEB. Consequently, negative minute patterns having sidewalls formed vertical to the substrate can be provided. By using the negative minute patterns having such resist profile, processing of the underlying layer with the dimension well controlled can be realized.

In accordance with a method of forming minute patterns using a positive chemically amplifying type resist of another aspect of the present invention, the resist film is selectively irradiated with light and thereafter, an electric field is applied to the resist film. Consequently, catalyst, for example $H^+$ ions destroying the capability of preventing dissolution of dissolution preventing agent generated in the resist film move vertically downward, suppressing diffusion of $H^+$ ions in the lateral direction at the time of PEB. Consequently, positive minute patterns having sidewalls formed vertical to the substrate can be provided. By using positive minute patterns having such resist profile, processing of underlying layer with well controlled dimension can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a minute pattern using a negative chemically amplifying type resist, comprising the steps of:

preparing a negative chemically amplifying type resist including a base resin, a cross-linking agent for cross-linking the base resin, and a radiation sensitive catalyst generator for generating a catalyst for the cross-linking of said base resin;

forming a resist film on a substrate by applying said negative chemically amplifying type resist on the substrate and by drying the same;

selectively irradiating said resist film with light;

after said irradiation, heating said resist film;

after said irradiation, applying an electric field to said resist film; and developing the resist film to remove nonradiated portions of the resist film, said developing being effected subsequent to said resist heating and said electric field application.

2. A method according to claim 1, wherein
the catalyst of cross-linking of said base resin comprises $H^+$ ions.

3. A method according to claim 1, wherein
the direction of application of the electric field to said resist film is vertical to said resist film.

4. A method according to claim 1, wherein
said step of applying an electric field to the resist film is carried out prior to the step of heating the resist film.

5. A method according to claim 1, wherein said step of applying an electric field to the resist film is carried out simultaneously with the step of heating the resist film.

6. A method according to claim 1, wherein said step of applying an electric field to the resist film is carried out in vacuum.

7. A method according to claim 1, wherein said negative chemically amplifying type resist comprises Microposit SAL601-ER7 resist.

8. A method according to claim 1, wherein drying of said resist is performed for 30 to 90 sec at the temperature of 50° to 100° C.

9. A method according to claim 1, wherein the strength of said electric field is in the range of 10 to 100 KV/mm.

10. A method according to claim 1, wherein heating of said resist film is carried out at a temperature in a range of 100° to 140° C.

11. A method according to claim 1, wherein said light comprises deep UV ray.

12. A method according to claim 1, wherein the resist film is formed on a silicon substrate.

* * * * *